United States Patent
Belveze et al.

(10) Patent No.: US 7,539,721 B2
(45) Date of Patent: May 26, 2009

(54) ANALOG FILTER WITH PASSIVE COMPONENTS FOR DISCRETE TIME SIGNALS

(75) Inventors: Fabrice Belveze, Fontanil-Cornillon (FR); Luc Garcia, Saint Paul de Varces (FR)

(73) Assignee: STMicroelectronics SA, Montrouge (FR)

(*) Notice: Subject to any disclaimer, the term of this patent is extended or adjusted under 35 U.S.C. 154(b) by 727 days.

(21) Appl. No.: 11/244,773

(22) Filed: Oct. 6, 2005

(65) Prior Publication Data

US 2006/0071707 A1   Apr. 6, 2006

(30) Foreign Application Priority Data

Oct. 6, 2004   (FR) ................... 04 52279

(51) Int. Cl.
*G06G 7/02* (2006.01)

(52) U.S. Cl. .................................... 708/819
(58) Field of Classification Search .................. 708/819
See application file for complete search history.

(56) References Cited

U.S. PATENT DOCUMENTS

| 5,325,322 | A | * | 6/1994 | Bailey et al. ................ 708/819 |
| 5,388,063 | A | * | 2/1995 | Takatori et al. ............ 708/819 |
| 5,563,819 | A | * | 10/1996 | Nelson ....................... 708/819 |
| 6,177,897 | B1 | | 1/2001 | Williams, III |
| 2003/0083033 | A1 | | 5/2003 | Stazewski et al. |
| 2004/0102908 | A1 | | 5/2004 | Larson et al. |

OTHER PUBLICATIONS

French Search Report, FR655453, May 11, 2005.

* cited by examiner

*Primary Examiner*—Tan V Mai
(74) *Attorney, Agent, or Firm*—Lisa K. Jorgensen; Paul F. Rusyn; Graybeal Jackson LLP

(57) ABSTRACT

A filter intended to receive a discrete time signal at a sampling clock frequency, comprising a determined number, greater than 2, of filtering units, each filtering unit comprising head capacitors in a number equal to the determined number, assembled in parallel between an input terminal and the terminal of an integration capacitor; and means for connecting, in successive clock cycles in a number equal to the determined number, successively each head capacitor to the input terminal, and for then simultaneously connecting the head capacitors to the integration capacitor, and in which the successive clock cycles during which the head capacitors of a filtering unit are connected to the input terminal are offset by one clock cycle from one filtering unit to the next one.

24 Claims, 4 Drawing Sheets

ANALOG FILTER WITH PASSIVE COMPONENTS FOR DISCRETE TIME SIGNALS

PRIORITY CLAIM

This application claims priority from French patent application No. 04/52279, filed Oct. 6, 2004 which is incorporated herein by reference.

BACKGROUND OF THE INVENTION

1. Field of the Invention

Embodiments of the present invention relate to analog filters for discrete time signals. A discrete time signal is a signal obtained, for example, by sampling an initial analog signal at a determined sampling frequency, and thus corresponding to a sequence of samples of the analog signal not yet converted into binary.

2. Discussion of the Related Art

In signal processing, it may be desirable to perform a filtering operation on a discrete time signal obtained before the discrete time signal is converted into binary. Such a filtering operation enables, for example, limiting the bandwidth of the discrete time signal, especially to avoid aliasing of the signal spectrum when a decimation is performed on the discrete time signal samples before analog-to digital conversion. The filtering also enables eliminating the wide-band noise which is within the band of interest, or eliminating unwanted high-amplitude frequency components, as can be the case for a radio receiver.

The filtering of a discrete time signal may be performed by an active analog filter with switched capacitances. Such are for example the filters described in publication "Design Techniques for MOS Switch Capacitor Ladder Filters" of G. M. Jacobs et al., IEEE Transactions on Circuits and Systems, vol. CAS-25, December 1978, pages 1014-1021. However, such filters use operational amplifiers, which may be disadvantageous, especially for systems for which the power consumption must be as low as possible or for which the sampling frequency is high, as is for example the case for radio receivers.

It is thus desirable to use a filter with passive components only. As an example, a filter performing a running means over the last samples of the discrete time signal generally provides an efficient filtering. Such a filter is called a SINC filter, since the expression of the Fourier transform of the filter is dose to a sinc x.

US patent application 2003/0083033 filed by Texas Instruments Company describes a device for processing a discrete time signal performing a decimation operation, only comprising passive components and comprising a SINC filter placed before a decimation unit, which is itself followed by a single-pole filter.

Even though such a filter enables partly limiting the filter aliasing, the attenuation obtained by the SINC filter at aliasing frequencies may be insufficient for certain applications. Further, the single-pole filter provided downstream of the decimation unit comes too late, since, due to the decimation operation, the spectrum aliasing of the signal provided by the SINC filter has already occurred.

In particular, for applications for cellular receivers, such as receivers of GSM type (Global System for Mobile Communications) or of WCDMA type (Wideband Code Division Multiple Access), it is necessary to provide a sufficient attenuation of the frequencies likely to alias in a decimation operation, which can generally only be obtained via a single SINC filter.

SUMMARY OF THE INVENTION

An embodiment of the present invention aims at providing an original analog filter structure for a discrete time signal enabling easier forming of any finite pulse response filter and of almost any infinite pulse response filter.

An embodiment of the present invention provides a filter intended to receive, on an input terminal, a discrete time signal at a sampling clock frequency, comprising at least one filtering stage comprising a determined number, greater than 2, of filtering units, each filtering unit comprising head capacitors in a number equal to the determined number, assembled in parallel between the input terminal and the terminal of an integration capacitor connected to an output terminal of the filtering stage; and means for connecting, in successive clock cycles in a number equal to the determined number, successively each head capacitor to the input terminal, and for then simultaneously connecting the head capacitors to the integration capacitor, and in which the successive clock cycles during which the head capacitors of a filtering unit are connected to the input terminal are offset by one clock cycle from one filtering unit to the next one.

According to an embodiment of the present invention, the filter comprises means for successively connecting each integration capacitor to the output terminal at the sampling frequency.

According to an embodiment of the present invention, the filter further comprises, for each filtering unit, a decimation stage connected to the output terminal of the filtering stage, and comprises a capacitor, the filtering stage comprising means for simultaneously connecting the integration capacitors to the capacitor of the decimation stage.

According to an embodiment of the present invention, the filter comprises, for each filtering unit, means for setting to a determined constant value the charge stored in each head capacitor after the head capacitors are connected to the integration capacitor.

According to an embodiment of the present invention, the capacitances of the head capacitors are identical for all filtering units, said filtering stage performing an unweighted running means filtering.

According to an embodiment of the present invention, the filter comprises, for each filtering unit, means for setting to a determined constant value the charge stored in the integration capacitor after the integration capacitor is connected to the output terminal.

According to an embodiment of the present invention, for each filtering unit, the capacitances of the head capacitors are different, the filtering units being identical, said filtering stage performing a weighted running means filtering.

According to an embodiment of the present invention, the filter comprises, for at least one head capacitor of each filtering unit, means for, when said head capacitor is connected simultaneously with the other head capacitors of the filtering unit to the integration capacitor of the filtering unit, providing the integration capacitor with the inverse of the charge of the head capacitor.

According to an embodiment of the present invention, the filter comprises a single additional capacitor comprising a terminal connected to the input terminal and another terminal connected to a reference voltage source, the charge stored in the single additional capacitor being not set back to a determined constant value during the filter operation.

According to an embodiment of the present invention, the filter comprises, for each filtering unit, an additional capacitor assembled in parallel with the head capacitors, and means, during all the successive clock cycles in which the head capacitors are connected to the input terminal, for connecting the additional capacitor to the input terminal, the charge stored in the additional capacitor being not set back to zero after the head capacitors are connected to the integration capacitor.

According to an embodiment of the present invention, the filter comprises, for each filtering unit, auxiliary head capacitors in a number equal to the determined number, assembled in parallel between the input terminal and the terminal of an auxiliary integration capacitor connected to an auxiliary output terminal of the filtering stage; and means for, in the successive clock cycles in a number equal to the determined number which follow the successive clock cycles in which the head capacitors are connected to the input terminal, successively connecting each auxiliary head capacitor to the input terminal, and for then simultaneously connecting the auxiliary head capacitors to the auxiliary integration capacitor.

The foregoing features and advantages of the present invention, as well as others, will be discussed in detail in the following non-limiting description of specific embodiments in connection with the accompanying drawings.

DETAILED DESCRIPTION

The following discussion is presented to enable a person skilled in the art to make and use the invention. Various modifications to the embodiments will be readily apparent to those skilled in the art and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of the present application will be described for an analog discrete time signal filter used in a radio reception application. However, as will be specified in further detail hereafter, embodiments of the present invention may apply to the forming of any type of discrete time signal analog filter.

Figure 1:
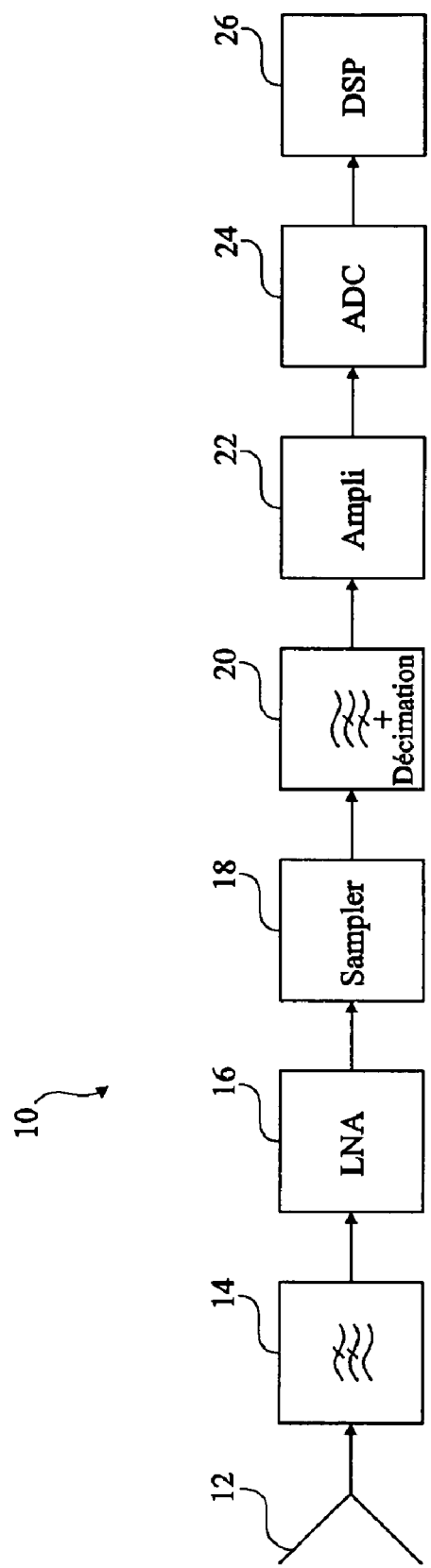
FIG. 1 schematically shows some components of a radio receiver.

FIG. 1 shows an example of a radio receiver 10 comprising an antenna 12 providing a high-frequency modulated analog signal to a band-pass filter 14 which performs a first rough filtering on the modulated signal. The filtered signal is sent to a low-noise amplifier 16 (LNA). The amplified signal provided by low-noise amplifier 16 is sent to a sampler 18 which provides, at a sampling frequency $f_S$, a discrete time signal formed of a series of samples of the amplified signal. The sampling operation simultaneously enables transfer of the signal in baseband. The sampled values are provided to a filtering and decimation unit 20 according to an embodiment of the present invention, which will be described in further detail hereafter and which performs both a filtering operation and a decimation operation. The sub-sampled filtered discrete time signal provided by filtering and decimation unit 20 is sent to an amplifier 22. An analog-to-digital converter 24 (ADC) receives the amplified signal provided by amplifier 22 and provides digital values to a digital signal-processing unit 26 (DSP).

In the present embodiment, a filter performs a running means, at the P-th order (that is, cascaded P times), over the last M samples of the signal sampled at sampling frequency $f_S$. Integer M corresponds to the filter wavelength at order 1. The transfer function of such a filter is the following:

$$H(z) = (1 + z^{-1} + z^{-2} + \ldots + z^{-M+1})^P = \left(\sum_{i=0}^{M-1} z^{-i}\right)^P = \left(\frac{1-z^{-M}}{1-z^{-1}}\right)^P$$

This corresponds to the following Fourier transform:

$$H(f) = \left(e^{-j\pi(M-1)f/f_S} \frac{\sin(\pi M f / f_S)}{\sin(\pi f / f_S)}\right)^P$$

The Fourier transform being close to a sinc x elevated to power P, such a filter is called a SINC filter of order P.

This embodiment of the present invention provides an original filter stage structure, which will be called hereafter the general filter stage. Each general filter stage performs, in the present a SINC filtering of order 1 over the last M samples of the discrete time signal. To obtain a filter of order P, it is enough to arrange P general filter stages in cascade.

However, in the present embodiment filtering and decimation unit 20 enables performing, simultaneously to the filtering operation, a decimation operation. In this case, the decimation ratio, corresponding to the number of input samples for one output sample, is equal to the length of the elementary filter of order 1, that is, M. For this purpose, filtering and decimation unit 20 is formed of P stages in cascade, the P−1 first stages each corresponding to a specific stage which will be called the decimation terminal hereafter. Further, for such a unit 20 which also performs a decimation operation, the penultimate filter stage, having a structure corresponding to that of a general filter stage, is controlled in a specific way with respect to the other general filter stages.

More generally, to form a SINC filter of order 1 performing no decimation operation, a single stage corresponding to the general filter stage is used. To form a SINC filter of order 2 performing a decimation operation, two stages are used, a first specifically-controlled general stage and a terminal decimation stage. To form a SINC filter of order 3 performing a decimation operation, three stages are used, a conventionally-controlled general filter stage, a general filter stage specifically controlled for the decimation operation, and a terminal decimation stage.

Figure 2:
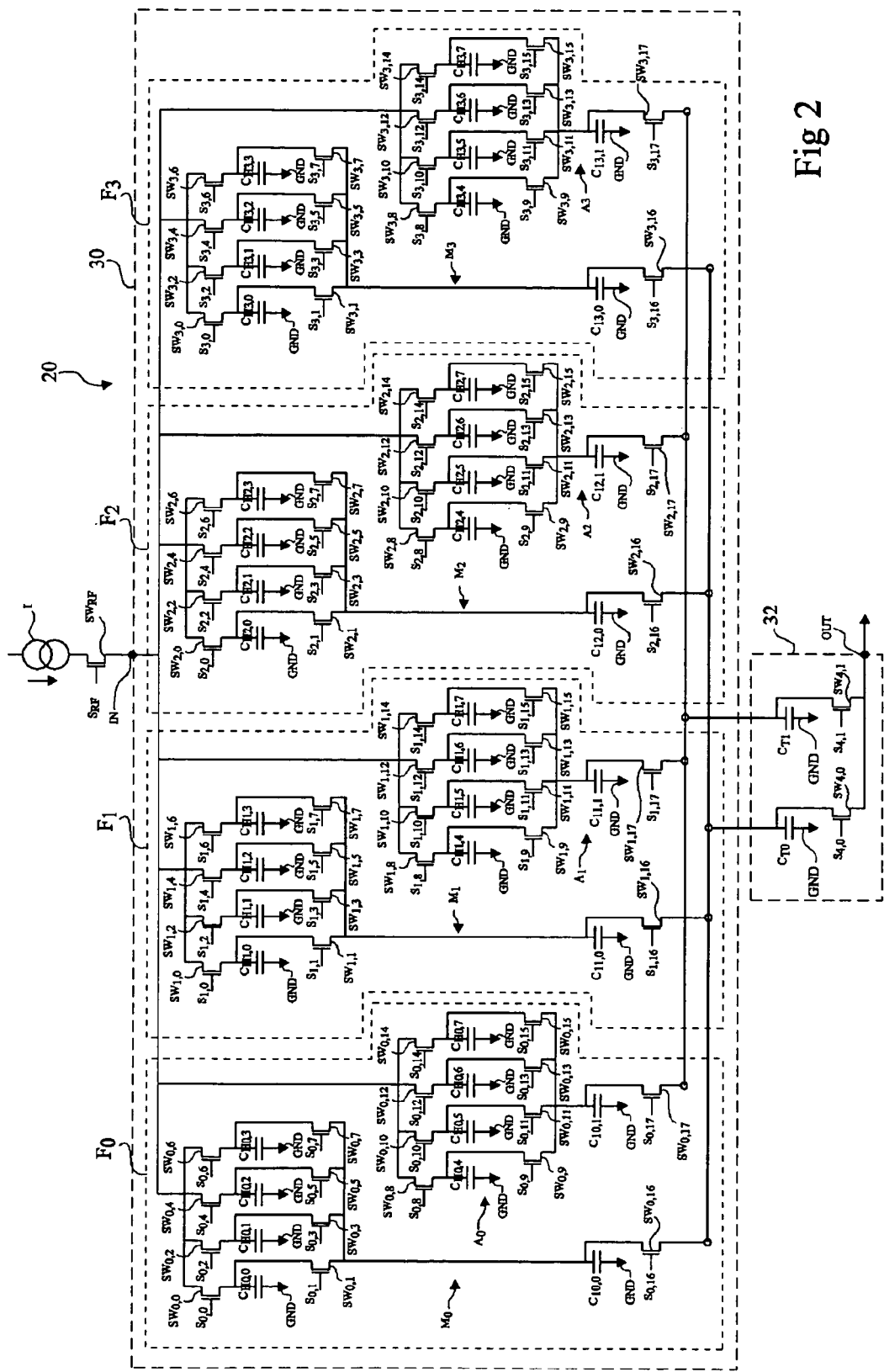
FIG. 2 shows an example of the forming of a filter according to one embodiment of the present invention.

FIG. 2 shows an example of the forming of a filtering and decimation unit 20 for which P=2 and M=4 adapted to performing, simultaneously to the filtering operation, a decimation operation according to one embodiment of the present invention.

In FIG. 2, a current source/which corresponds, for example, to the last stage of low-noise amplifier 16 of FIG. 1 has been shown. Current source I delivers a current having an intensity proportional to the amplitude of the analog signal to be processed. A switch $SW_{RF}$, controlled by a signal $S_{RF}$, is provided between current source I and unit 20 according to this embodiment of the present invention. Switch $SW_{RF}$ corresponds to sampler 18 of FIG. 1. Signal $S_{RF}$ corresponds to a square signal having, as a frequency, sampling frequency $f_S$.

Unit 20 comprises a first stage 30 having a structure corresponding to the structure of the general filter stage and a second stage 32 corresponding to the terminal decimation stage. Unit 20 comprises an input terminal IN and an output terminal OUT. First stage 30 comprises M filtering units designated as $F_i$, i being an integer varying from 0 to M−1. Filtering units $F_i$ are identical. Each filtering unit $F_i$ comprises a main unit $M_i$ and an auxiliary unit $A_i$ which have identical structures. Main unit $M_i$ comprises M head capacitors $C_{Hi,j}$, j being an integer varying from 0 to M−1. The capacitances of capacitors $C_{Hi,j}$ are identical. Each capacitor $C_{Hi,j}$ has a first terminal connected to a reference voltage, for example, ground GND, and a second terminal connected to a first terminal of a switch $SW_{i,2j}$. The second terminals of switches $SW_{i,2j}$ are connected in common to input terminal IN of unit 20. Each switch $SW_{i,2j}$ is controlled by a control signal $S_{i,2j}$. A junction point of capacitor $C_{Hi,j}$ and the associated switch $SW_{i,2j}$ is connected to a first terminal of a switch $SW_{i,2j+1}$, controlled by a control signal $S_{i,2j+1}$. The second terminals of switches $SW_{i,2j+1}$ are connected in common to a first terminal of a capacitor $C_{Ii,0}$ having its second terminal connected to reference voltage GND. The first terminal of capacitor $C_{Ii,0}$ is connected to a first terminal of a switch $SW_{i,4M}$, controlled by a control signal $S_{i,4M}$. The second terminals of switches $SW_{i,4M}$, with i ranging from 0 to M−1, are connected to a node $N_1$.

Auxiliary unit $A_i$ has the same structure as main unit $M_i$. For j varying from 0 to M−1, each reference switch $SW_{i,2j}$, $S_{i,2j}$, $SW_{i,2j+1}$, and $S_{i,2j+1}$ used for main unit $M_i$ is respectively replaced with references $SW_{i,2M+2j}$, $S_{i,2M+2j}$, $SW_{i,2M+2j+1}$, and $S_{i,2M+2j+1}$ for auxiliary unit $A_i$. Further, reference $C_{Ii,0}$ used for main unit $M_i$ is replaced with reference $C_{Ii,1}$ and references $SW_{i,4M}$ and $S_{i,4M}$ are respectively replaced with references $SW_{i,4M+1}$ and $S_{i,4M+1}$. The second terminals of switches $SW_{i,4M+1}$ are connected to a node $N_2$.

Terminal decimation stage 32 of unit 20 comprises a capacitor $C_{T0}$ having a first terminal connected to node $N_1$, and a second terminal connected to reference voltage GND. The first terminal of capacitor $C_{T0}$ is connected to a first terminal of a switch $SW_{M,0}$, controlled by a control signal $S_{M,0}$, and having its second terminal connected to terminal OUT of unit 20. Terminal decimation stage 32 comprises a capacitor $C_{T1}$ having a first terminal connected to node $N_2$, and a second terminal connected to reference voltage GND. The first terminal of capacitor $C_{T1}$ is connected to a first terminal of a switch $SW_{M,1}$, controlled by a control signal $S_{M,1}$, having its second terminal connected to output terminal OUT of unit 20.

Unit 20 according to this embodiment of the present invention comprises means, not shown, for setting to zero or to a constant non-zero quiescent value the charge stored in each capacitor.

The operating principle of first stage 30 of unit 20 according to this embodiment of the present invention will now be described. The current provided by current source I is transmitted to terminal IN of unit 20 by switch $SW_{RF}$ for one half-period $1/(2f_S)$ at sampling frequency $f_S$. For each filtering unit $F_i$, with i varying from 0 to M−1, switches $SW_{i,2j}$, with j varying from 0 to M−1, are controlled so that, on each turning-on of switch $SW_{RF}$, a capacitor $C_{Hi,j}$, with j varying from 0 to 2M−1, is connected to terminal IN. The current provided by current source I is then integrated in the capacitor $C_{Hi,j}$ connected to terminal IN. A current-to-charge conversion (or, equivalently, a current-to-voltage conversion) is thus obtained. The resulting processing over the initial analog signal thus amounts to a SINC filtering, for which the lobes of the frequency response have a width $2f_S$, followed by a sampling and by a maintaining of the sampled value. The bandwidth of the initial analog signal being generally much smaller than $f_S$, such a processing has practically no effect upon the obtained signal. The storage of a sample of the initial analog signal at the level of capacitor $C_{Hi,j}$ is thus obtained.

For each filtering unit $F_i$, capacitors $C_{Hi,j}$, with j varying from 0 to M−1, of main unit $M_i$ are used to store M successive samples of the initial analog signal. Capacitors $C_{Hi,M+j}$, with j varying from 0 to M−1, of auxiliary unit $A_i$, are then used to store the next M samples of the initial analog signal. While M samples are stored at the level of auxiliary unit $A_i$, the M samples previously stored at the level of main unit $M_i$ are simultaneously provided to capacitor $C_{Ii,0}$ which performs an integration over the M stored samples. Similarly, when M samples are stored at the level of main unit $M_i$, the M samples previously stored at the level of auxiliary unit $A_i$ are simultaneously provided to capacitor $C_{Ii,1}$ which performs an integration over the M stored samples. Each filtering unit $F_i$, with i varying from 0 to M−1, operates similarly, but with an offset of one sampling period between each filtering unit $F_i$. Since the M filtering units $F_i$, with i varying from 0 to M−1, are offset by one sampling period, integration capacitors $C_{Ii,0}$ are capable of providing new filtered values at the sampling frequency. This thus generally corresponds to the performing of a running means of length M with no decimaton.

Figure 3:
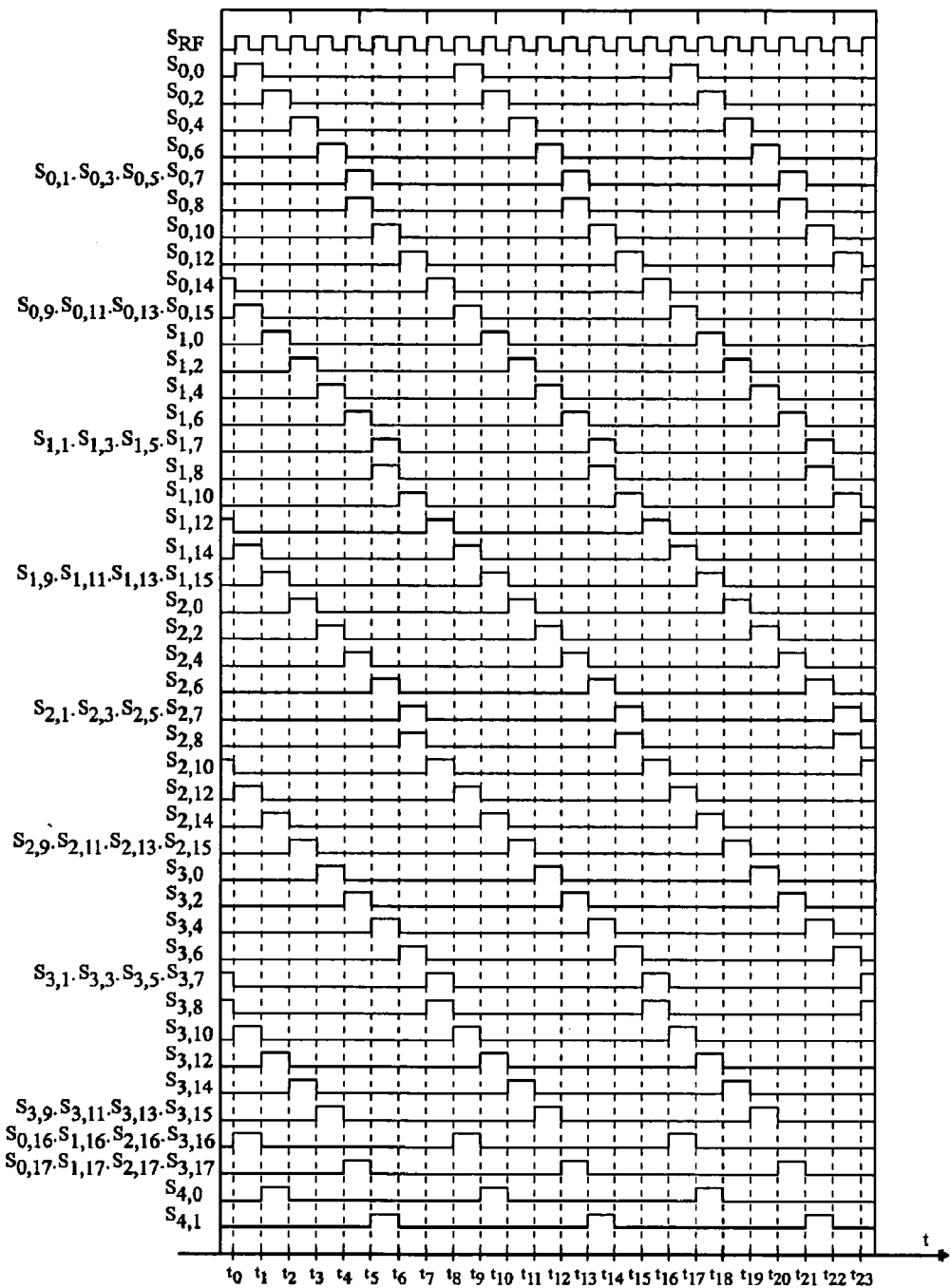
FIG. 3 shows timing diagrams of control signals of the filter of FIG. 2.

FIG. 3 shows an example of a detailed timing diagram of the control signals of the switches of unit 20 of FIG. 2 which illustrates the foregoing description. Times $t_0$ to $t_{23}$ represent successive times. It is considered hereafter that a switch is on when the corresponding control signal is high, and that it is off when the control signal is low. The following description more specifically illustrates the operation of filtering unit $F_0$.

At time $t_0$, switch $SW_{0,0}$ is on, causing the integration in capacitor $C_{H0,0}$ of the current provided to input terminal IN. Switches $SW_{0,2}$, $SW_{0,4}$, and $SW_{0,6}$ are off. Similarly, switches $SW_{0,1}$, $SW_{0,3}$, $SW_{0,5}$, and $SW_{0,7}$ are off. Switches $SW_{0,8}$, $SW_{0,10}$, $SW_{0,12}$, and $SW_{0,14}$ are off and switches $SW_{0,9}$, $SW_{0,11}$, $SW_{0,13}$, and $SW_{0,15}$ are on, causing the sharing of the charges stored in capacitors, $C_{H0,4}$, $C_{H0,5}$, $C_{H0,6}$, and $C_{H0,7}$ and integration capacitor $C_{I0,1}$. The charge finally stored at the level of capacitor $C_{I0,1}$ is thus representative of the average of the four charges stored in capacitors $C_{H0,4}$, $C_{H0,5}$, $C_{H0,6}$, and $C_{H0,7}$.

At time $t_1$, switches $SW_{0,9}$, $SW_{0,11}$, $SW_{0,13}$, and $SW_{0,15}$ are off. Switch $SW_{0,0}$ is off, while switch $SW_{0,2}$ is on, causing the integration of the current provided by current source I in capacitor $C_{H0,1}$. Simultaneously, the charges stored by capacitors $C_{H0,4}$, $C_{H0,5}$, $C_{H0,6}$, and $C_{H0,7}$ are set back to zero.

At time $t_2$, switch $SW_{0,2}$ is off and switch $SW_{0,4}$ is on, causing the integration of the current provided by current source I in capacitor $C_{H0,2}$.

At time $t_3$, switch $SW_{0,4}$ is off and switch $SW_{0,6}$ is on, causing the integration of the current provided by current source I in capacitor $C_{H0,3}$.

At time $t_4$, switch $SW_{0,8}$ is on, causing the integration of the current provided by current source I in capacitor $C_{H0,4}$. Simultaneously, switches $SW_{0,1}$, $SW_{0,3}$, $SW_{0,5}$, and $SW_{0,7}$ are on, causing the sharing of the charges stored in capacitors, $C_{H0,0}$, $C_{H0,1}$, $C_{H0,2}$, and $C_{H0,3}$ and integration capacitor $C_{I0,0}$. The resulting charge stored in capacitor $C_{I0,0}$ is thus representative of the average of the four charges stored in capacitors $C_{H0,0}$, $C_{0,1}$, $C_{H0,2}$, and $C_{H0,3}$.

At time $t_5$, switch $SW_{0,8}$ is off and switch $SW_{0,10}$ is on, causing the integration of the current provided by current source I in capacitor $C_{H0,5}$. Simultaneously, the charges stored by capacitors $C_{H0,0}$, $C_{H0,1}$, $C_{H0,2}$, and $C_{H0,3}$ are set back to zero.

At time $t_6$, switch $SW_{0,10}$ is off and switch $SW_{0,12}$ is on, causing the integration of the current provided by current source I in capacitor $C_{H0,6}$.

At time $t_7$, switch $SW_{0,12}$ is off and switch $SW_{0,14}$ is on, causing the integration of the current provided by current source I in capacitor $C_{H0,7}$.

From time $t_8$ to time $t_{15}$ and from time $t_{16}$ to time $t_{23}$, the switches associated with filtering unit $F_1$ are controlled according to the same sequence as that implemented from time $t_0$ to time $t_7$.

The switches associated with filtering units $F_1$ to $F_3$ are operated according to the same sequence as the switches associated with filtering unit $F_0$, but with an offset of one sampling clock cycle with respect to one another. That is, the switches associated with filtering unit $F_1$ are controlled with an offset of one sampling clock cycle with respect to filtering unit $F_0$. As an example, from time $t_1$ to time $t_8$, the switches associated with filtering unit $F_1$ are controlled according to the same sequence as that implemented for the corresponding switches of filtering unit $F_0$ from time to $t_0$ time $t_7$. The switches associated with filtering unit $F_2$ are actuated with an offset of two sampling clock cycles with respect to filtering unit $F_0$. As an example, from time $t_2$ to time $t_9$, the switches associated with filtering unit $F_2$ are controlled according to the same sequence as that implemented for the switches corresponding to filtering unit $F_0$ from time $t_0$ to time $t_7$. The switches associated with filtering unit $F_3$ are operated with an offset of three sampling clock cycles with respect to filtering unit $F_0$. As an example, from time $t_3$ to time $t_{10}$, the switches associated with filtering unit $F_3$ are controlled according to the same sequence as that implemented for the corresponding switches of filtering unit $F_0$, from time $t_0$ to time $t_7$.

For each filtering unit $F_i$, with i varying from 0 to M–1, each integration capacitor $C_{Ii,0}$ performs a sum over M successive samples, followed by decimation of ratio M, that is, it integrates M samples and provides the result, then integrates M other successive samples and provides the new result, etc. However, there is an offset of one sample between integration capacitor $C_{I1,0}$ and integration capacitor $C_{I0,0}$, an offset of two samples between integration capacitor $C_{I2,0}$ and integration capacitor $C_{I0,0}$, and an offset of three samples between integration capacitor $C_{I3,0}$ and integration capacitor $C_{I0,0}$. Thus, for M successive sampling clock cycles, M new values are respectively stored in integration capacitors $C_{Ii,0}$, with i varying from 0 to M–1. The operation so obtained thus corresponds to a running means of length M with no decimation. For the next M sampling clock cycles, the same operation is obtained with integration capacitors $C_{Ii,1}$, with i varying from 0 to M–1.

In more detailed fashion for filtering unit $F_0$, at time $t_4$, as described previously, switches $SW_{0,1}$, $SW_{0,3}$, $SW_{0,5}$, and $SW_{0,7}$ are on. Capacitors $C_{H,0}$, $C_{H0,1}$, $C_{H0,2}$, $C_{H0,3}$, and $C_{I0,0}$ thus share their charge. The final charge stored in capacitor $C_{I0,0}$ is thus proportional to the sum of the charges stored in the four capacitors $C_{H0,0}$, $C_{H0,1}$, $C_{H0,2}$, and $C_{H0,3}$. The sum of four successive samples is thus performed. Simultaneously (and possibly during the next three sampling clock cycles), switch $SW_{0,17}$ is on. The charge stored in capacitor $C_{I0,1}$ is then read, then set back to zero. Four sampling clock cycles later, at time $t_8$, switches $SW_{0,9}$, $SW_{0,11}$, $SW_{0,13}$, and $SW_{0,15}$ are on. Capacitors $C_{H0,4}$, $C_{H0,5}$, $C_{H0,6}$, $C_{H0,7}$, and $C_{I0,1}$ thus share their charge. The charge stored in capacitor $C_{I0,0}$ is thus proportional to the sum of the charges stored in the four capacitors $C_{H0,4}$, $C_{H0,5}$, $C_{H0,6}$, and $C_{H0,7}$. The sum of four successive samples is thus performed. Simultaneously, or during the next three sampling clock cycles, the charge stored in capacitor $C_{I0,0}$ is read by turning on switch $SW_{0,16}$, then is set back to zero. A similar operation is performed for the other filtering units $F_1$, $F_2$, and $F_3$, with the previously-mentioned sampling clock cycle offset.

In the present embodiment, since stage 30 is directly connected to a decimation stage 32, the control of switches $SW_{i,16}$ and $SW_{i,17}$, with i varying from 0 to M–1, is specific.

In the case where there is no decimaton, the 2M switches $SW_{i,16}$ and $SW_{i,17}$, with i varying from 0 to M–1, are connected together to a common node instead of being separated in two groups as in the case shown in FIG. 2. The common node then corresponds to the stage output. Switches $SW_{i,16}$, with i varying from 0 to M–1, are turned on one after the other in four successive cycles and switches $SW_{i,17}$, with i varying from 0 to M–1, are turned on one after the other in the next four successive cycles. General stage 30 then provides a new filtered value for each sampling clock cycle.

In the present example where stage 32 corresponds to a terminal decimation stage, the times of reading and resetting of the integration capacitors are different from what has been described in the foregoing paragraph. As in the previous case, the parallel integration of charges at the level of the M integration capacitors $C_{Ii,0}$, with i varying from 0 to M–1, is performed, but with offsets with respect to one another. As an example, at time $t_4$, an integration of M successive samples is performed at the level of capacitor $C_{I0,0}$. At time $t_5$, an integration operation with an offset of one sample is performed at the level of capacitor $C_{I1,0}$. At time $t_6$, an integration operation with an offset of one sample is performed at the level of capacitor $C_{I2,0}$ and finally, at time $t_7$, an integration operation with an offset of one sample is performed at the level of capacitor $C_{I3,0}$. Once the integration has been performed at the level of capacitor $C_{I0,0}$, the charge is maintained, as well as that on capacitors $C_{I1,0}$ and $C_{I2,0}$, until the integration operation at the level of capacitor $C_{I3,0}$ is performed. At time $t_8$, switches $SW_{i,16}$, with i varying from 0 to M–1, are then simultaneously turned on, so that the charges on integration capacitors $C_{I0,0}$, with i varying from 0 to M–1, are simultaneously put in common with the next stage. At the same time, an integration operation is performed at the level of capacitor $C_{Ii,0}$, then successively in capacitors $C_{I1,1}$, $C_{I2,1}$, and $C_{I3,1}$, respectively at times $t_9$, $t_{10}$, and $t_{11}$. On integration at the level of capacitor $C_{I1,1}$, the charges stored in capacitors $C_{Ii,0}$, with i varying from 0 to M–1, are set back to zero. At time $t_{12}$, switches $SW_{i,17}$, with i varying from 0 to M–1, are then simultaneously turned on, and capacitors $C_{Ii,1}$, with i varying from 0 to M–1, simultaneously share their charge with the next stage.

The operation of decimation stage 32 is the following. When the M switches $SW_{i,16}$, with i varying from 0 to M–1, are on, the M capacitors $C_{Ii,0}$, with i varying from 0 to M–1, share their charge with capacitor $C_{T0}$. This enables obtaining the sum of the M samples contained in capacitors $C_{Ii,0}$, with i varying from 0 to M–1, by applying a filtering function of SINC type. Since a single sample is provided to output terminal OUT while M samples are received at input terminal IN, a decimation operation is performed. Thus, in two of the next seven cycles, the charge stored in capacitor $C_{T0}$ is read by the turning-on of switch $SW_{4,0}$, then set back to zero (or to a non-zero constant quiescent value). Four clock cycles after the integration operation at the level of capacitor $C_{T0}$, switches $SW_{i,17}$, with i varying from 0 to M–1, are turned on. The charge stored in capacitor $C_{T1}$ is then representative of the sum of the charges previously contained in capacitors $C_{H,1}$, with i varying from 0 to M−1. In two of the next seven cycles, the charge stored in capacitor $C_{T1}$ is read, then set back to zero (or to a non-zero constant quiescent value).

The present embodiment enables forming a filter only by means of passive components, which enables reducing the power consumption of the filter.

Further, the present embodiment has the following additional advantages.

First, the obtained filtering function is relatively simple since it consists in the arranging in cascade of stages, each performing a running means.

Second, the pulse response of the filter is substantially formed of "1s", which avoids forming of complex combinations of capacitors with different capacitances.

Third, the filter according to the present embodiment is only slightly sensitive to variations of the filter coefficients.

Fourth, the obtained filtering function is only slightly sensitive to the absolute values of the capacitances of the filter capacitors, since only the capacitance ratio is to be taken into account. It is easier to obtain capacitance ratios of accurate values than to obtain accurate values for the actual capacitances.

Fifth, the order of the filter according to this embodiment of the present invention can be easily increased or decreased. Thus, the attenuation around the filter zeroes can be adjusted according to needs.

Sixth, the frequency response of the filter according to this embodiment of the present invention contains regularly spaced-apart zeroes. The filter is thus particularly capable of preventing a spectrum aliasing with a high rejection at aliasing frequencies. Such a filter is thus particularly well adapted to the implementation of a filtering operation in combination with a decimation operation. It is then sufficient to select the decimation sampling frequency to be equal to the frequency interval between the zeroes of the frequency response of the filter.

According to a variation of this embodiment of the present invention, if the sampling frequency is sufficiently low, the previously-described integration, read, and reset operations may be performed in a single sampling clock cycle. In this case, auxiliary units $A_i$, with i varying from 0 to M−1, of each filtering unit $F_i$, may be suppressed.

According to another variation of this embodiment of the present invention, the control signals of the switches, shown in FIG. 3, are set to the high state for a duration equal to one sampling clock cycle. It should be understood that some control signals may be maintained high for a duration greater than that of a sampling cycle. For example, the turning-on of switch $SW_{4,0}$, enabling reading of the charge stored in capacitor $C_{T0}$, may last for more than one clock cycle. Indeed, it may extend over seven clock cycles, one clock cycle being used for the setting back to zero of the charge of capacitor $C_{T0}$. More generally, the time for which the switches are turned on is selected to reach a compromise between the consumption and the radiated noise, the bandwidth of the radiated noise being all the wider as the time for which the switches are turned on is short According to another alternative embodiment, switches $SW_{i,16}$ and $SW_{i,17}$, with i varying from 0 to M−1, are connected to a common node. In this case, this node is connected to capacitors $C_{T0}$ and $C_{T1}$ by two separate switches. When an integration operation must be performed at the level of capacitor $C_{T0}$, that is, on turning-on of switches $SW_{i,16}$, with i varying from 0 to M−1, the switch connecting the common node to capacitor $C_{T0}$ is then on, the switch connecting the common node to capacitor $C_{T1}$ being off. When an integration operation must be performed at the level of capacitor $C_{T1}$, that is, on turning-on of switches $SW_{i,17}$, with i varying from 0 to M−1, the switch connecting the common node to capacitor $C_{T1}$ is then on, the switch connecting the common node to capacitor $C_{T0}$ being off.

The present embodiment has been described for the performing of a filtering and decimation operation. However, a filter, formed of several general filter stages, may be used to perform an interpolation operation. In this case, the first filter stage is replaced with a stage of duplication of the sampled signals received by the filter.

The present embodiment has been described for the performing of a filtering function of SINC type of any order. However, the previously-described filter structure may be adapted to form any finite impulse response filter (FIR).

For this purpose, the previously-described general filter stage structure is kept. More specifically, filter units $F_i$, with i varying from 0 to M−1, are identical to one another and for each filter unit $F_i$, main unit $M_i$ is identical to auxiliary unit $A_i$. In other words, for fixed values of i and j, the capacitances of capacitors $C_{Hi,j}$ and $C_{Hi,M+j}$ are identical and for i varying from 0 to M−1, the capacitances of capacitors $C_{Hi,j}$ are identical. However, for main unit $M_i$, the capacitances of capacitors $C_{Hi,j}$, with j varying from 0 to M−1, are selected to be different from one another.

To obtain any finite pulse response filter, it is necessary to provide this filter with a charge stored in an input capacitor.

Figure 4:
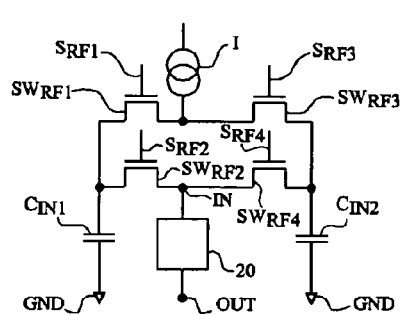
FIGS. 4 to 7 show alternative filters according to other embodiments of the present invention.

FIG. 4 shows an example of the forming of a circuit enabling providing the filter with a charge stored in a capacitor. The circuit comprises a first input capacitor $C_{IN1}$ having a terminal connected to ground GND. The other terminal of input capacitor $C_{IN1}$ is connected to the output of current source/via a switch $SW_{RF1}$ controlled by signal $S_{RF1}$ and to input terminal IN via a switch $SW_{RF2}$ controlled by signal $S_{RF2}$. The circuit comprises a second input capacitor $C_{IN2}$ having a terminal connected to ground GND. The other terminal of input capacitor $C_{IN2}$ is connected to the output of current source I via a switch $SW_{RF3}$ controlled by signal $S_{RF3}$ and to input terminal IN via a switch $SW_{RF4}$ controlled by signal $S_{RF4}$. Capacitors $C_{IN1}$ and $C_{IN2}$ have the same capacitance $C_{IN}$. Switches $SW_{RF1}$, $SW_{RF2}$, $SW_{RF3}$, and $SW_{RF4}$ are controlled so that at one sampling clock cycle, capacitor $C_{IN1}$ is connected to the output of current source I while capacitor $C_{IN2}$ is connected to input terminal IN, and that at the next sampling clock cycle, capacitor $C_{IN2}$ is connected to the output of current source I while capacitor $C_{IN1}$ is connected to input terminal IN. The circuit also comprises means, not shown, for setting to zero or to a constant non-zero quiescent value the charge stored in each capacitor $C_{IN1}$ and $C_{IN2}$ after a reading through input terminal IN.

In the case of a filter with several stages, the input capacitors of a stage of the filter other than the first stage correspond to the integration capacitors of the previous stage.

At each clock cycle, for each filtering unit $F_i$, with i varying from 0 to M−1, a switch $SW_{i,2j}$, with j varying from 0 to M−1, is turned on. One of input capacitors $C_{IN1}$, $C_{IN2}$ is thus simultaneously connected to M head capacitors of the filter stage. The final charge stored in each head capacitor is then proportional to the product of its capacitance and of the charge initially stored in the input capacitor. A sampling operation being subsequently performed at the level of capacitor $C_{H,0}$ or $C_{Ii,1}$ over M successive samples stored at the level of filtering unit $F_i$, such a stage performs a filtering function having the following z transform:

$$H(z) = \sum_{j=0}^{M-1} a_j z^{-1}$$

where coefficient $a_j$ is proportional to the capacitance of capacitor $C_{Hi,M-1-j}$. The expression of $a_j$ is given by the following relation:

$$a_j = \frac{C_{Hi,M-1-j}}{C_{IN} + \sum_{j=0}^{j=M-1} C_{Hi,j}}$$

By this method, the obtained coefficients $a_j$ are positive. To obtain negative coefficients, it is sufficient to reverse the biasing of the corresponding head capacitor $C_{Hi,j}$ in the read operation.

Figure 5:
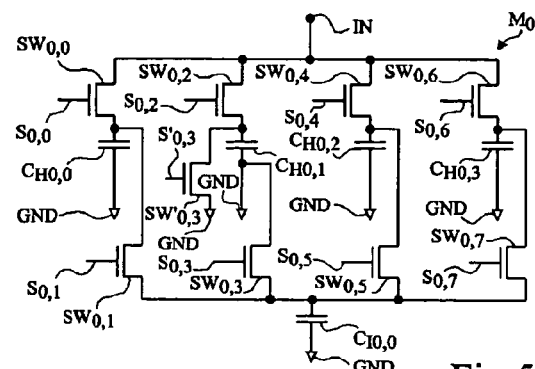

FIG. 5 illustrates, as an example, an alternative embodiment of the filter providing a negative coefficient $a_2$. Only main unit $M_0$ of filtering unit $F_0$ is shown in FIG. 5, the structure of the other auxiliary and main units being the same. The terminal of capacitor $C_{H0,1}$ connected to ground GND is also connected to switch $SW_{0,3}$ and the terminal of capacitor $C_{H0,1}$ connected to switch $SW_{0,2}$ is also connected to ground GND via an additional switch $SW'_{0,3}$ controlled by signal $S'_{0,3}$. For the reading of the charge stored in capacitor $C_{H0,1}$, signals $S'_{0,3}$ and $S_{0,3}$ are set to a high level. The inverse of the charge stored in capacitor $C_{H0,1}$ is thus shared with integration capacitor $C_{I0,0}$.

By providing several stages in cascade, any filter FIR can thus be obtained.

In the forming of any finite impulse response filter, the capacitances of capacitors $C_{Hi,j}$, with i varying from 0 to M−1 and j varying from 0 to 2M−1, are different. It may however be desirable for the capacitance seen from the input to be constant. An additional capacitor is then added, in parallel with each capacitor $C_{Hi,j}$, so that the sum of the capacitance of capacitor $C_{Hi,j}$ and of the capacitance of the additional associated capacitor is constant and identical for each capacitor $C_{Hi,j}$—additional capacitor pair, for i varying from 0 to M−1 and j varying from 0 to 2M−1. When capacitor $C_{Hi,j}$ is connected to input terminal IN, the associated additional capacitor also is. However, only capacitor $C_{Hi,j}$ is connected to the associated integration capacitor $C_{Ii,0}$ or $C_{Ii,1}$ to obtain the previously-described function.

Further, the previously-described filter structure may be adapted to form almost any infinite impulse response filter (IIR filter). Several modifications to the structure of the general filter stage structure may be provided to add poles to the frequency response of the filter.

A first modification consists, for each filtering unit $F_i$, with i varying from 0 to M−1, of not setting back to zero the charge stored at the level of integration capacitor $C_{Ii,0}$ or $C_{Ii,1}$. This amounts to multiplying the z transform of the general filter stage with the following recursive term H':

$$H'(z) = \frac{\alpha z^{-1}}{1 - \alpha z^{-M}} \text{ with } \alpha = \frac{1}{1 + M\frac{C_H}{C_I}}$$

where $C_H$ is the capacitance, identical in the case of a SINC filter, of capacitors $C_{Hi,j}$, with j varying from 0 to 2M−1, and $C_I$ is the capacitance of integration capacitor $C_{Ii,0}$ or $C_{Ii,1}$. A recursive term may be added to each filter stage, where the recursive term can be modified for each filter stage by the selection of ratio $C_H/C_I$, which may be different for each filter stage.

Figure 6:
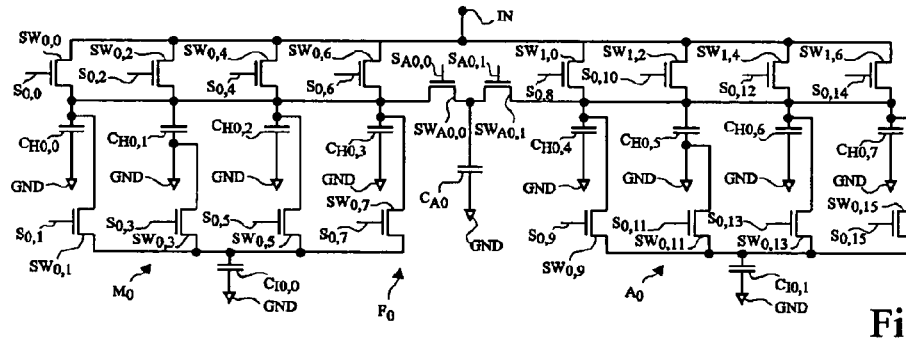

FIG. 6 illustrates a second modification which consists, for each filtering unit $F_i$, with i varying from 0 to M−1, of providing an additional capacitor $C_{Ai}$ connected in parallel to capacitors $C_{Hi,j}$, with i varying from 0 to M−1, of main unit $M_i$, and to capacitors $C_{Hi,j}$, with j varying from 0 to 2M−1, of auxiliary unit $A_i$. Capacitors $C_{Ai}$, with i varying from 0 to M−1, have the same capacitance $C_A$. In FIG. 6, only filtering unit $F_0$ is shown as an example, the other units having a similar structure. A terminal of additional capacitor $C_{A0}$ is connected to ground GND. The other terminal of capacitor $C_{A0}$ is connected, via a switch $SW_{A0,0}$, controlled by signal $S_{A0,0}$, to the terminal of each capacitor $C_{H0,0}$, $C_{H0,1}$, $C_{H0,2}$, and $C_{H0,3}$ not connected to ground GND and is connected, via a switch $SW_{A0,1}$, controlled by signal $S_{A0,1}$, to the terminal of each capacitor $C_{H0,4}$, $C_{H0,5}$, $C_{H0,6}$, and $C_{H0,7}$ not connected to ground GND. The switches associated with additional capacitor $C_{Ai}$ are controlled so that additional capacitor $C_{Ai}$ is connected, at a given time, only to the capacitors of one of units $M_i$ or $A_i$, which is then connected to input terminal IN of the filter and not to the head capacitors of the other unit $M_i$ or $A_i$, which then takes part in an operation of integration at the level of the integration capacitor or of setting back to zero of the head capacitor charges. The charge of capacitor $C_{Ai}$ is never set back to zero. This amounts to multiplying the z transform of the filter stage by the following recursive term H':

$$H'(z) = \frac{(1-\alpha)z^{-1}}{1 - \alpha z^{-1}} \text{ with } \alpha = \frac{C_A}{C_A + C_H}$$

Figure 7:
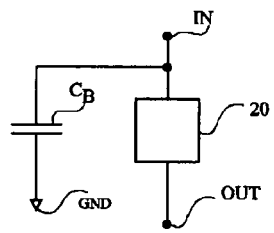

FIG. 7 illustrates a third modification, which consists of providing an additional capacitor $C_B$ having a terminal connected to ground GND and its other terminal permanently connected to input terminal IN. The charge of capacitor $C_B$ is never set back to zero. This amounts to multiplying the z transform of the filter stage by the following recursive term H":

$$H''(z) = \frac{(1-\alpha)z^{-1}}{1 - \alpha z^{-1}} \text{ with } \alpha = \frac{C'_B}{C'_B + MC_H}$$

where $C'_B$ is the capacitance of additional capacitor $C_B$. To obtain the same pole as with the second previously-described modification, it is sufficient to select a capacitor $C_B$ having a capacitance $C'_B$ which is M times as large as the previously-mentioned capacitance $C_A$. The size of the circuit obtained with capacitor $C_B$ of capacitance $M*C_A$ is thus substantially the same as that which is obtained with M capacitors $C_{Ai}$, with i varying from 0 to M−1, of capacitance $C_A$. However, as compared to the second previously-described modification, 2M switches are spared. The obtained circuit is thus simpler, less noisy and less consuming than that obtained with the second modification.

Figure 8:
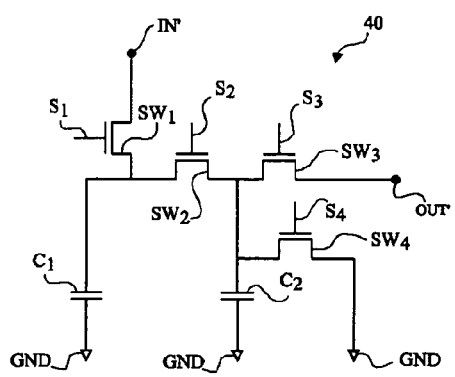
FIGS. 8 and 9 show examples of the forming of circuits enabling modifying the transfer function of the filter according to another embodiment of the present invention.

FIG. 8 shows an example of the forming of a circuit which, more generally, enables adding a single pole to a stage of the filter. Single-pole circuit 40 may be added before or after a filter stage. Single-pole circuit 40 comprises two capacitors $C_1$ and $C_2$ of respective capacitance $C'_1$ and $C'_2$. A terminal of capacitor $C_1$ is connected to ground GND and the other terminal of capacitor $C_1$ is connected to an input terminal IN' via a switch $SW_1$ controlled by signal $S_1$. A terminal of capacitor $C_2$ is connected to ground GND and the other terminal of capacitor $C_2$ is connected to the junction point of capacitor $C_1$ and switch $SW_1$ via a switch $SW_2$ controlled by signal $S_2$. The junction point of switch $SW_2$ and capacitor $C_2$ is connected to an output terminal OUT' via a switch $SW_3$ controlled by signal $S_3$. The junction point of switch $SW_2$ and of capacitor $C_2$ is connected to ground GND via a switch $SW_4$ controlled by signal $S_4$.

Switches $SW_1$ to $SW_4$ to are controlled to set to zero (or to a constant non-zero quiescent value) the charge stored in capacitor $C_2$ after reading of this charge, on each sampling clock pulse, while the charge stored in capacitor $C_1$ is never set back to zero. The z transform H' of such a single-pole circuit is the following:

$$H'(z) = \frac{(1-\alpha)z^{-1}}{(1-\alpha z^{-1})} \text{ where } \alpha = \frac{C'_1}{C'_1 + C'_2}$$

By assembling in cascade any FIR filter, such as described previously, with as many single-pole circuits as necessary, almost any FIR filter is obtained. The only restriction is that one cannot, in this manner, obtain a filter having conjugated complex poles, nor real positive pulses.

Figure 9:
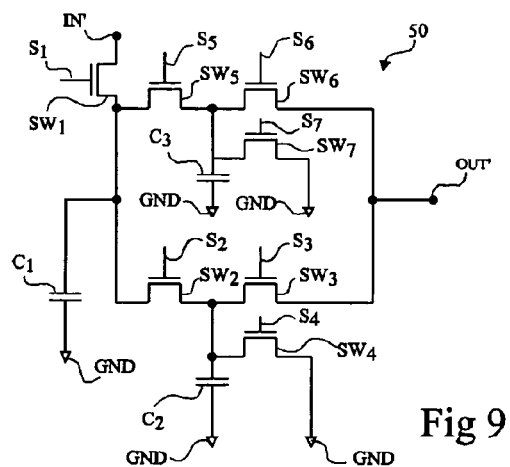

FIG. 9 illustrates a variation of the circuit of FIG. 8. In addition to the components of circuit 40 shown in FIG. 8, single-pole circuit 50 comprises a capacitor $C_3$ having a terminal connected to ground GND and having its other terminal connected to the junction point of capacitor $C_1$ and switch $SW_1$ via a switch $SW_5$ controlled by signal $S_5$. The junction points of switch $SW_5$ and capacitor $C_3$ is connected to output terminal OUT' via a switch $SW_6$ controlled by signal $S_6$. The junction point of switch $SW_5$ and capacitor $C_3$ is connected to ground GND via a switch $SW_7$ controlled by signal S7. Capacitor $C_3$ is alternately used instead of capacitor $C_2$, with a periodicity of two sampling clock pulses. This enables reading and setting back to zero (or to a non-zero constant quiescent value) the charge stored in capacitor $C_2$ (respectively, $C_3$) while capacitor $C_3$ (respectively, $C_2$) is charged from input terminal IN'.

According to the sampling frequency, an additional capacitor $C_4$ (not shown) assembled similarly to capacitors $C_2$ and $C_3$ may be provided. While one of capacitors $C_2$, $C_3$, or $C_4$ is charged, the charge stored by the next capacitor is read and the charge stored by the last capacitor is set back to zero (or to a constant non-zero quiescent value). Each of the capacitors plays the same role with a circular rotation of the roles and a periodicity of three clock pulses.

Of course, the present invention is likely to have various alterations, modifications, and improvements which will readily occur to those skilled in the art. In particular, in the previously-described embodiments, the switches are formed by means of MOS transistors. However, the switches could be formed differently, for example, via bipolar transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A filter intended to receive, on an input terminal, a discrete time signal at a sampling clock frequency, comprising at least one filtering stage comprising a determined number, greater than 2, of filtering units, each filtering unit comprising:
    head capacitors in a number equal to the determined number, assembled in parallel between the input terminal and the terminal of an integration capacitor connected to an output terminal of the filtering stage; and
    means for connecting, in successive clock cycles in a number equal to the determined number, successively each head capacitor to the input terminal, and for then simultaneously connecting the head capacitors to the integration capacitor,
    and wherein the successive clock cycles during which the head capacitors of a filtering unit are connected to the input terminal are offset by one clock cycle from one filtering unit to the next one.

2. The filter of claim 1, comprising means for successively connecting each integration capacitor to the output terminal at the sampling frequency.

3. The filter of claim 1, further comprising, for each filtering unit, a decimation stage connected to the output terminal of the filtering stage, and comprising a capacitor, the filtering stage comprising means for simultaneously connecting the integration capacitors to the capacitor of the decimation stage.

4. The filter of claim 1, comprising for each filtering unit means for setting to a determined constant value the charge stored in each head capacitor after the head capacitors are connected to the integration capacitor.

5. The filter of claim 4, comprising, for each filtering unit, an additional capacitor assembled in parallel with the head capacitors, and means, during all the successive clock cycles in which the head capacitors are connected to the input terminal, for connecting the additional capacitor to the input terminal, the charge stored in the additional capacitor being not set back to zero after the head capacitors are connected to the integration capacitor.

6. The filter of claim 1, wherein the capacitances of the head capacitors are identical for all filtering units, said filtering stage performing an unweighted running means filtering.

7. The filter of claim 1, comprising, for each filtering unit, means for setting to a determined constant value the charge stored in the integration capacitor after the integration capacitor is connected to the output terminal.

8. The filter of claim 1, wherein, for each filtering unit the capacitances of the head capacitors are different, the filtering units being identical, said filtering stage performing a weighted running means filtering.

9. The filter of claim 1, comprising, for at least one head capacitor of each filtering unit, means for, when said head capacitor is connected simultaneously with the other head capacitors of the filtering unit to the integration capacitor of the filtering unit, providing the integration capacitor with the inverse of the charge of the head capacitor.

10. The filter of claim 1, comprising a single additional capacitor comprising a terminal connected to the input terminal and another terminal connected to a reference voltage source, the charge stored in the single additional capacitor being not set back to a determined constant value during the filter operation.

11. The filter of claim 1, comprising, for each filtering unit:
auxiliary head capacitors in a number equal to the determined number, assembled in parallel between the input terminal and the terminal of an auxiliary integration capacitor connected to an auxiliary output terminal of the filtering stage; and
means for, in the successive clock cycles in a number equal to the determined number which follow the successive clock cycles in which the head capacitors are connected to the input terminal, successively connecting each auxiliary head capacitor to the input terminal, and for then simultaneously connecting the auxiliary head capacitors to the auxiliary integration capacitor.

12. A cell receptor, such as a GSM cell receptor or a WCDMA cell receptor, comprising at least one filter according to claim 1.

13. A filter, comprising:
an input node adapted to receive a discrete time signal;
at least two filtering circuits, each filtering circuit including,
a plurality of head capacitors, each head capacitor including a first node adapted to receive a reference voltage and including a second node;
a first switching circuit coupled between second nodes of the head capacitors and the input node and adapted to receive a first clocking signal having a corresponding period, the first switching circuit operable to sequentially couple the second nodes of the head capacitors to the input node responsive to the first clocking signal, the second nodes being sequentially coupled at a rate corresponding to the period of the first clocking signal and the first clocking signal applied to each filtering circuit being offset by one period relative to the first clocking signal applied to the adjacent filtering circuit;
an integration capacitor having a first node adapted to receive a reference voltage and a second node;
a second switching circuit coupled between the second nodes of the head capacitors and the second node of the integration capacitor and adapted to receive a second clocking signal, the second switching circuit operable to simultaneously couple the second nodes of the head capacitors to the second node of the integration capacitor responsive to the second clocking signal.

14. The filter of claim 13 wherein each filtering circuit further comprises a third switching circuit coupled between the second node of the integration capacitor and an output node, each third switching circuit adapted to receive a third clocking signal and the third switching circuits operable in parallel to simultaneously couple the nodes of the respective integration capacitors to the output node responsive to the third clocking signal.

15. The filter of claim 13 wherein each of the head capacitors comprises a single capacitive element.

16. The filter of claim 13 wherein each filter circuit includes X head capacitors and wherein the first switching circuit comprises X MOS transistors coupled respectively in parallel between the second nodes of the head capacitors and the input node, and wherein the first clocking signal comprises X respective clocking signals applied to the respective MOS transistors, each such clocking signal being offset by one period relative to one another.

17. The filter of claim 13 wherein the values of the head capacitors are equal for each filtering circuit.

18. The filter of claim 13 wherein the values of the head capacitors within each filtering circuit are different and are the same among the filtering circuits.

19. An electronic system, comprising:
electronic circuitry including a filter, the filter including,
an input node adapted to receive a discrete time signal;
at least two filtering circuits, each filtering circuit including,
a plurality of head capacitors, each head capacitor including a first node adapted to receive a reference voltage and including a second node;
a first switching circuit coupled between second nodes of the head capacitors and the input node and adapted to receive a first clocking signal having a corresponding period, the first switching circuit operable to sequentially couple the second nodes of the head capacitors to the input node responsive to the first clocking signal, the second nodes being sequentially coupled at a rate corresponding to the period of the first clocking signal and the first clocking signal applied to each filtering circuit being offset by one period relative to the first clocking signal applied to the adjacent filtering circuit;
an integration capacitor having a first node adapted to receive a reference voltage and a second node;
a second switching circuit coupled between the second nodes of the head capacitors and the second node of the integration capacitor and adapted to receive a second clocking signal, the second switching circuit operable to simultaneously couple the second nodes of the head capacitors to the second node of the integration capacitor responsive to the second clocking signal.

20. The electronic system of claim 19 wherein the electronic circuitry comprises a cellular receiver.

21. The electronic system of claim 20 wherein the cellular receiver comprises a GSM or WCDMA type receiver.

22. A method of filtering a discrete time signal formed by sequential samples obtained at a sampling rate, comprising:
receiving a current for each sample, the current of each sample being proportional to a voltage value of the sample;
converting for each sample the current to a corresponding charge;
storing the converted charge at one of a plurality of charge storage nodes;
integrating the charge stored on all the plurality of charge storage nodes to develop an integrated charge;
storing the integrated charge on an interim node;
wherein the operations of receiving a current through storing the integrated charge define a filtering path and the method further including,
performing at least two filtering paths in parallel on the samples of the discrete time signal, wherein a clocking signal is applied to each filtering path to define a rate at which the current of each sample is received and the rate at which each current is converted to a corresponding charge, and wherein the clocking signals applied to all the filtering paths have the same period but an offset of one period or clock cycle from one filtering path to a next filtering path.

23. The method of claim 22 further comprising:
integrating the charge stored on the interim node of each filtering path to develop an output charge; and
storing the output charge on an output node.

24. The method of claim 22 wherein within each filtering path the charge stored on the charge storage nodes is weighted differently for each charge storage node within each filtering path, with the weightings being the same for each filtering path.

* * * * *